(12) United States Patent
Pang et al.

(10) Patent No.: US 11,025,217 B2
(45) Date of Patent: Jun. 1, 2021

(54) FAST AUTOMATIC GAIN CONTROL FOR HIGH PERFORMANCE WIRELESS COMMUNICATIONS IN SUBSTATION AUTOMATION

(71) Applicant: ABB Power Grids Switzerland AG, Baden (CH)

(72) Inventors: Zhibo Pang, Västerås (SE); Michele Luvisotto, Västerås (SE)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/969,602

(22) PCT Filed: Feb. 13, 2018

(86) PCT No.: PCT/EP2018/053527
§ 371 (c)(1),
(2) Date: Aug. 13, 2020

(87) PCT Pub. No.: WO2019/158183
PCT Pub. Date: Aug. 22, 2019

(65) Prior Publication Data
US 2021/0006219 A1  Jan. 7, 2021

(51) Int. Cl.
*H04L 27/28* (2006.01)
*H03G 3/30* (2006.01)
*H04L 27/26* (2006.01)

(52) U.S. Cl.
CPC ....... *H03G 3/3036* (2013.01); *H04L 27/2601* (2013.01); *H03G 2201/103* (2013.01)

(58) Field of Classification Search
CPC ................ H03G 3/3052; H03G 3/3068; H04L 27/3809; H04L 27/261; H04W 52/52
(Continued)

(56) References Cited

U.S. PATENT DOCUMENTS

| 5,638,375 A | 6/1997 | Dettro et al. |
| 8,107,565 B2 | 1/2012 | Li et al. |

(Continued)

FOREIGN PATENT DOCUMENTS

| CN | 204465882 U | 7/2015 |
| EP | 1126628 A1 | 8/2001 |
| WO | 0232018 A2 | 4/2002 |

*Primary Examiner* — Khai Tran
(74) *Attorney, Agent, or Firm* — Slater Matsil, LLP (57) ABSTRACT

There is provided mechanisms for automatic gain control in a wireless communication network for power grid control. The wireless communication network employs time based scheduling of packets. A method is performed by a packet receiver in the wireless communication network. The method comprises receiving a packet from a packet transmitter. The packet comprises a preamble. The preamble is composed of a single OFDM symbol. The preamble is represented by a sequence of samples. The method comprises applying automatic gain control to the sequence of samples after variable gain amplitude control has been applied to the sequence of samples. The automatic gain control involves applying an LPF to the sequence of automatic gain controlled samples. The LPF is selected from a bank of LPSs. Which LPF to apply depends on, according to the time based scheduling, from which packet transmitter the packet is received.

20 Claims, 6 Drawing Sheets

(58) Field of Classification Search
USPC .......................................... 375/260, 345, 347
See application file for complete search history.

(56) References Cited

U.S. PATENT DOCUMENTS

| | | |
|---|---|---|
| 2010/0189188 A1 | 7/2010 | Li et al. |
| 2011/0243038 A1 | 10/2011 | Challa et al. |
| 2013/0177112 A1* | 7/2013 | Lan ..................... H03G 3/3078 |
| | | 375/345 |
| 2013/0182804 A1* | 7/2013 | Yutaka ..................... H04B 1/30 |
| | | 375/347 |

* cited by examiner

FAST AUTOMATIC GAIN CONTROL FOR HIGH PERFORMANCE WIRELESS COMMUNICATIONS IN SUBSTATION AUTOMATION

CROSS-REFERENCE TO RELATED APPLICATIONS

This application is a national phase application of International Application No. PCT/EP2018/053527, filed on Feb. 13, 2018, which application is incorporated herein by reference.

TECHNICAL FIELD

Embodiments presented herein relate to a method, a packet receiver, a computer program, and a computer program product for automatic gain control in a wireless communication network for power grid control.

BACKGROUND

Wireless networks to be used in the control of power grids, for example in substation automation, require low latency and high reliability. Currently available industrial wireless standards, such as WirelessHART (where HART is short for Highway Addressable Remote Transducer) or Wireless Network for Industrial Automation-Factory Automation (WIA-FA), are not able to provide very high performance in these regards, because they rely on non-optimized physical (PHY) communications layers. For example, WIA-FA is based on the IEEE 802.11g/n PHY layer, whose minimum transmission time for a packet of 100 bits is around 30 µs, while many power grid applications, currently based on wired local area networks (LANs) compliant with IEC 61850, require a slot time of a few µs or even lower.

One cause of the long transmission time in IEEE 802.11 is the use of long preamble sequences at the PHY layer. However, the long preamble in IEEE 802.11 is used for many purposes, including automatic gain control (AGC), which is crucial to ensure reliable message delivery. In this respect, AGC is used in the radio front-end of wireless receivers to automatically tune the gain setting of a variable gain amplifier (VGA) so that the amplitude of the input signal can be adjusted to an optimal level, easing the task of further baseband processing blocks, such as analog-to-digital converter (ADC).

In traditional AGC systems, the gain setting of the VGA is initialized to a nominal value and it reaches the optimal value after a certain amount of time, called settling time. During this time, the AGC processes the first samples of the received preamble, which are discarded afterwards. This procedure is repeated for each packet, since the signals received by different transmitters have considerably different amplitudes.

The duration of the preamble in each packet, hence, cannot be lower than the AGC settling time, fundamentally limiting the achievable latency. In currently available systems, the optimal setting of the VGA gain is performed by using long preambles (e.g. as disclosed in US 20040242177 A1) or out-of-slot dedicated packets (e.g. as disclosed in US 20030091132 A1 and U.S. Pat. No. 5,524,009 A).

Hence, there is still a need for improved automatic gain control in wireless communication networks suitable for in the control of power grids.

SUMMARY

An object of embodiments herein is to provide efficient automatic gain control that does not suffer from the issues identified above, or at least where the issues noted above are reduced or mitigated.

According to a first aspect there is presented a method for automatic gain control in a wireless communication network for power grid control. The wireless communication network employs time based scheduling of packets. The method is performed by a packet receiver in the wireless communication network. The method comprises receiving a packet from a packet transmittter. The packet comprises a preamble. The preamble is composed of a single OFDM symbol. The preamble is represented by a sequence of samples. The method comprises applying automatic gain control to the sequence of samples after variable gain amplitude control has been applied to the sequence of samples. The automatic gain control involves applying an LIT to the sequence of automatic gain controlled samples. The LPF is selected from a bank of LPFs. Which LPF to apply depends on, according to the time based scheduling, from which packet transmitter the packet is received.

According to a second aspect there is presented a packet receiver for automatic gain control in a wireless communication network for power grid control. The wireless communication network employs time based scheduling of packets. The packet receiver comprises processing circuitry. The processing circuitry is configured to cause the packet receiver to receive a packet from a packet transmitter. The packet comprises a preamble. The preamble is composed of a single OFDM symbol. The preamble is 5 represented by a sequence of samples. The processing circuitry is configured to cause the packet receiver to apply automatic gain control to the sequence of samples after variable gain amplitude control has been applied to the sequence of samples. The automatic gain control involves applying an LPF to the sequence of automatic gain controlled samples. The LPF is selected from 10 a bank of LPFs. Which LPF to apply depends on, according to the time based scheduling, from which packet transmitter the packet is received.

According to a third aspect there is presented a computer program for automatic gain control in a wireless communication network for power grid control, the computer program comprising computer program code which, when run on a packet receiver, causes the packet receiver to perform a method according to the first aspect.

According to a fourth aspect there is presented a computer program product comprising a computer program according to the third aspect and a computer readable storage medium on which the computer program is stored. The computer readable storage medium could be a non-transitory computer readable storage medium.

Advantageously this provides efficient automatic gain control.

Advantageously, the proposed automatic gain control does not suffer from the issues noted above.

Advantageously, the proposed method allows an efficient packet structure, enabling low latency wireless communications.

Advantageously, the use of the short preamble enables low latency to be achieved by avoiding the latency caused by the settling time as necessary in traditional AGC systems.

Advantageously, high reliability automatic gain control is still ensured since which LPF to use is selected according to the time based scheduling, dictating from which packet receiver each packet is received.

It is to be noted that any feature of the first, second, third, and fourth aspects may be applied to any other aspect, wherever appropriate. Likewise, any advantage of the first aspect may equally apply to the second, third, and/or fourth aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art.

Like numbers refer to like elements throughout the description. Any step or feature illustrated by dashed lines should be regarded as optional.

Figure 1:
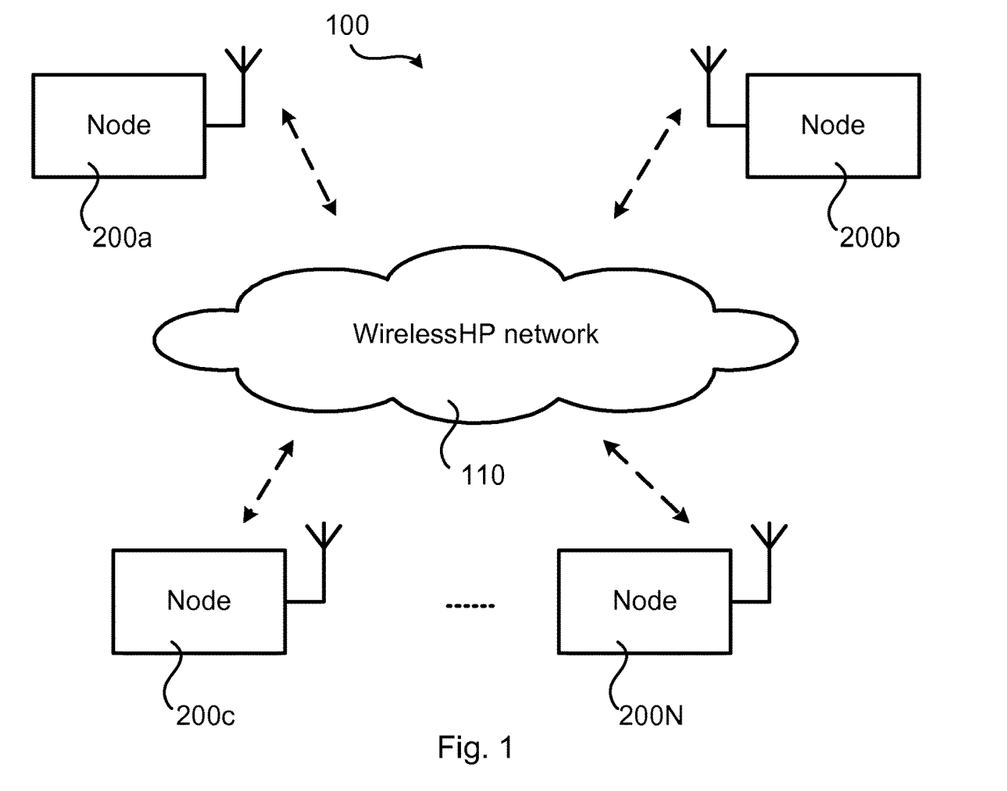
FIG. 1 is a schematic diagram illustrating a wireless communication network according to embodiments.

FIG. 1 schematically illustrates a wireless communication network 100 wherein the herein disclosed embodiments apply. Network entities denoted nodes 200a, 200b, . . . , 200N are equipped with a radio frequency (RF) front-end that allows them to communicate over a wireless network 110. Each node may represent a component of a substation automation system, such as a gateway, circuit breaker, circuit protector, transformer, switchgear, etc., that is configured for exchanging control messages.

Each node 200a-200N may selectively act as a packet transmitter or a packet receiver. Without loss of generality it will hereinafter be assumed that node 200a will act as a packet receiver and that any of nodes 200b-200N will act as a packet transmitter.

Figure 2:
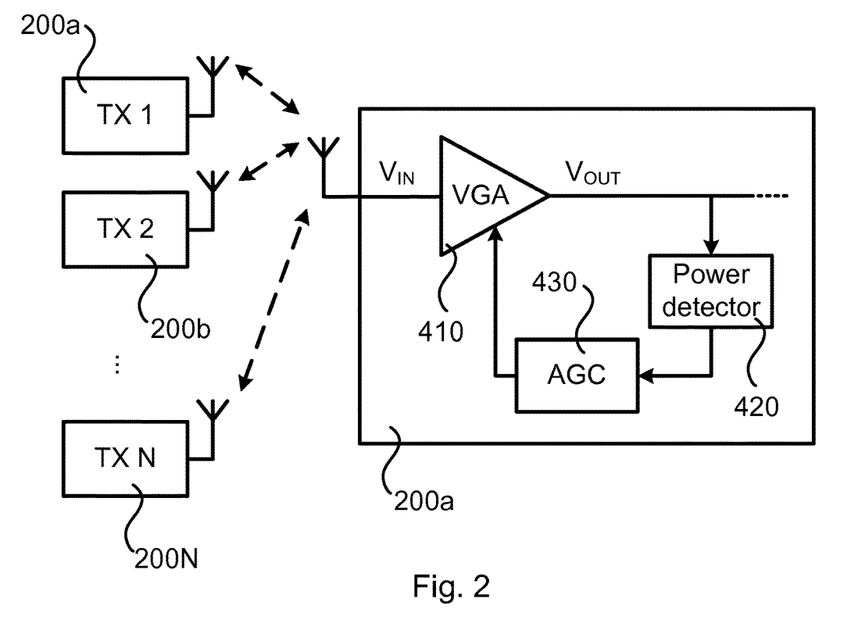
FIG. 2 schematically illustrates automatic gain control as used in a packet receiver according to state of the art.

FIG. 2 schematically illustrates typical application of automatic gain control in a packet receiver 200a. The packet receiver 200a employs a feed-back AGC architecture. In this architecture, the amplitude of the signal, $V_{OUT}$, at the output of the VGA 410 is first measured with a power detector 420. Then, this value is processed by an AGC 430, which compares it with a target level and feeds the difference to a low-pass filter (LPF). The LPF drives the gain setting of the VGA 410 so that $V_{OUT}$ converges to the target value after a certain settling time.

The power detector 420 and AGC 430 can be implemented with digital or analog components, depending on the required performance and complexity. Moreover, a feed-forward architecture can be considered, where the input signal, $V_{IN}$, to the VGA 410 is measured and fed to the AGC 430.

Regardless of the architecture, in current systems for automatic gain control the gain of the VGA 410 is re-initialized to a nominal target value at each different packet. Indeed, the amplitude of the input signal $V_{IN}$, and hence the optimal gain required to reach the target value, varies significantly according to the distance between packet transmitter 200b, 200c, . . . , 200N and packet receiver 200a, the transmitting power, etc. Consequently, each packet comprises an initial sequence of samples that are processed by the system for automatic gain control until convergence is reached after the settling time.

Figure 3:
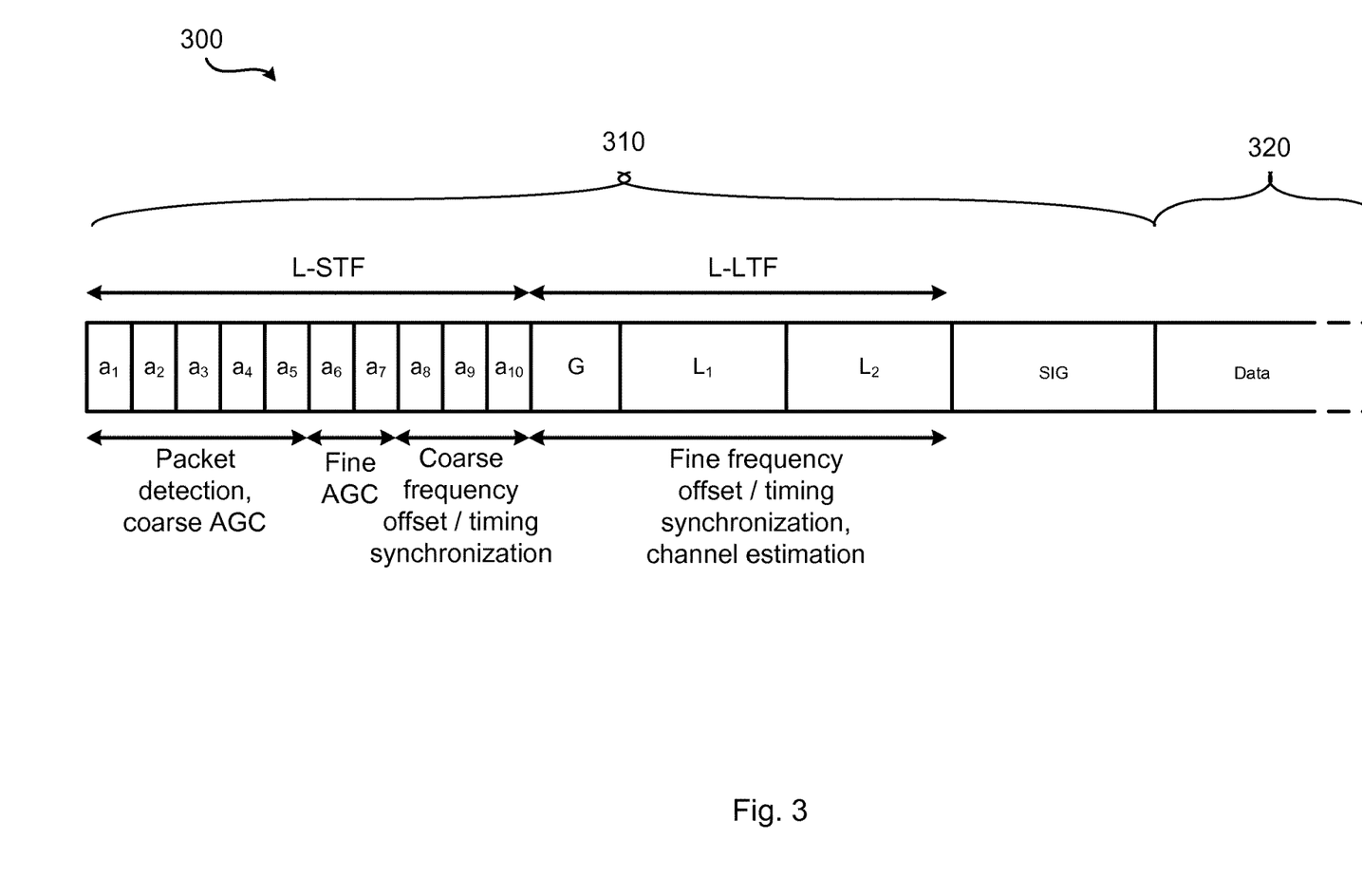
FIG. 3 schematically illustrates a packet structure according to state of the art.

As an illustrative example, FIG. 3 schematically illustrates the packet structure of a packet 300 as used in IEEE 802.11g. The packet 300 comprises a (PHY layer) preamble 310 and a data part 320. The preamble 310 comprises a legacy short training field (L-STF) part and a legacy long training field (L-LTF) part. In IEEE 802.11g the first short training sequences of the L-STF part of the preamble 310 are used for AGC.

In order to achieve low latency for short-size packets exchanged in wireless networks for power grid control applications, the size of the PHY layer preamble should be kept small, possibly limited to just one single orthogonal frequency-division multiplexing (OFDM) symbol. To preserve a good level of reliability, however, the packet receiver 200a must still be able to perform its usual functions, including automatic gain control, using only this single OFDM symbol.

The embodiments disclosed herein thus relate to mechanisms for automatic gain control in a wireless communication network 100 for power grid control. In order to obtain such mechanisms there is provided a packet receiver 200a, a method performed by the packet receiver 200a, a computer program product comprising code, for example in the form of a computer program, that when run on a packet receiver 200a, causes the packet receiver 200a to perform the method.

To achieve low latency the packet structure is optimized and a short preamble is used. Further, in order to ensure reliable communications, knowledge of the packet scheduling is used by the automatic gain control mechanism that allows simple and reliable automatic gain control, even when a short preamble is adopted.

Figure 4:
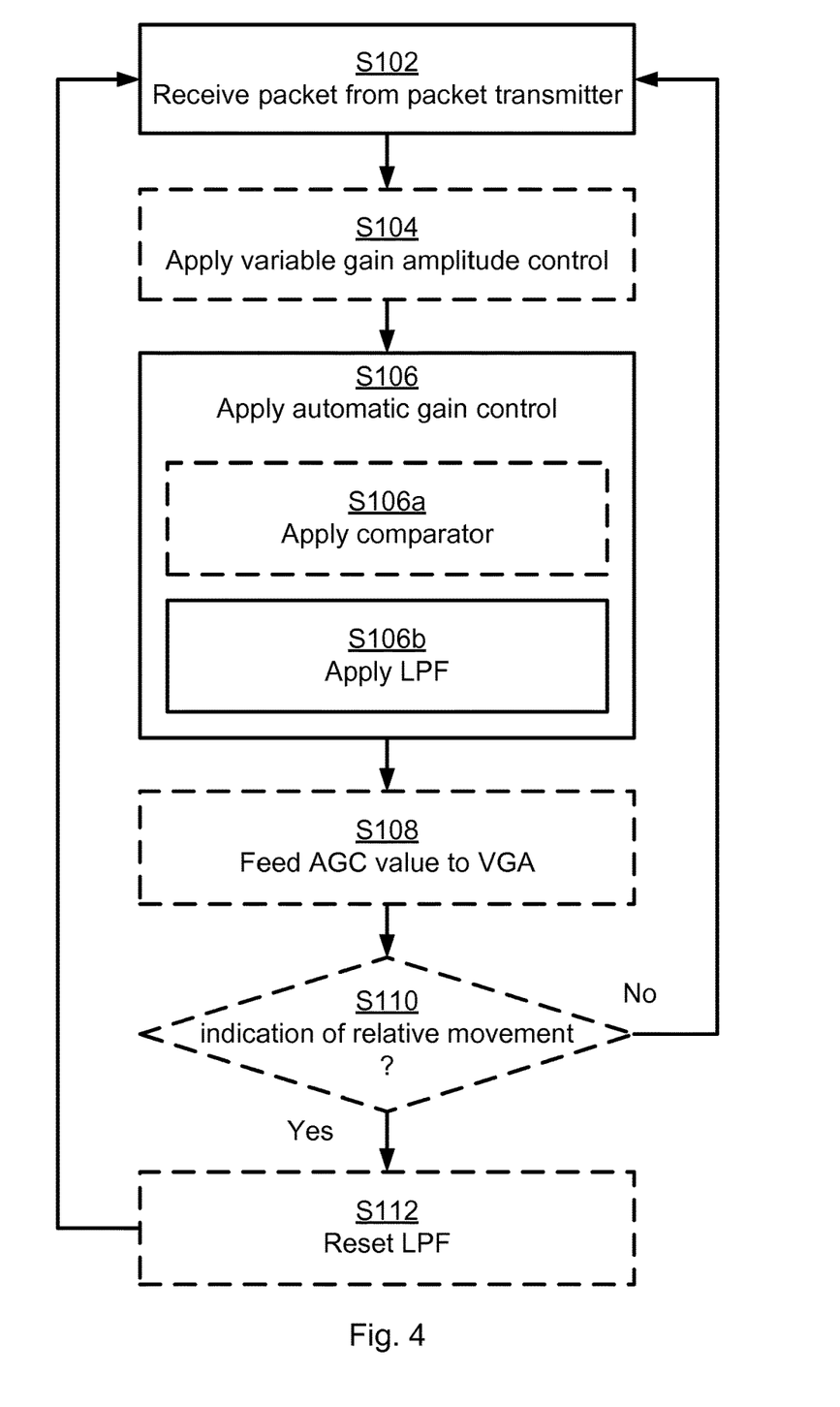
FIG. 4 is a flowchart of methods according to embodiments.

FIG. 4 is a flowchart illustrating embodiments of methods for automatic gain control in a wireless communication network 100 for power grid control. The wireless communication network 100 employs time based scheduling of packets. The methods are performed by the packet receiver 200a. The methods are advantageously provided as computer programs 820.

It is assumed that the node acting as packet receiver 200a receives a packet 300 from one of the other nodes acting as packet transmitter 200b-200N. The packet receiver 200a is thus configured to perform step S102:

S102: The packet receiver 200a receives a packet 300 from a packet transmitter 200b-200N.

The packet 300 comprises a preamble 310. The preamble 310 is composed of a single OFDM symbol. The preamble 310 is represented by a sequence of samples.

Automatic gain control is then applied. The packet receiver 200a is thus configured to perform step S106:

S106: The packet receiver 200a applies automatic gain control to the sequence of samples after variable gain amplitude control has been applied to the sequence of samples.

The time based scheduling of packets enables the automatic gain control to rapidly switch between different gain values as soon as a new transmission begins, i.e. as soon as a new packet is received by the packet receiver 200a.

Figure 5:
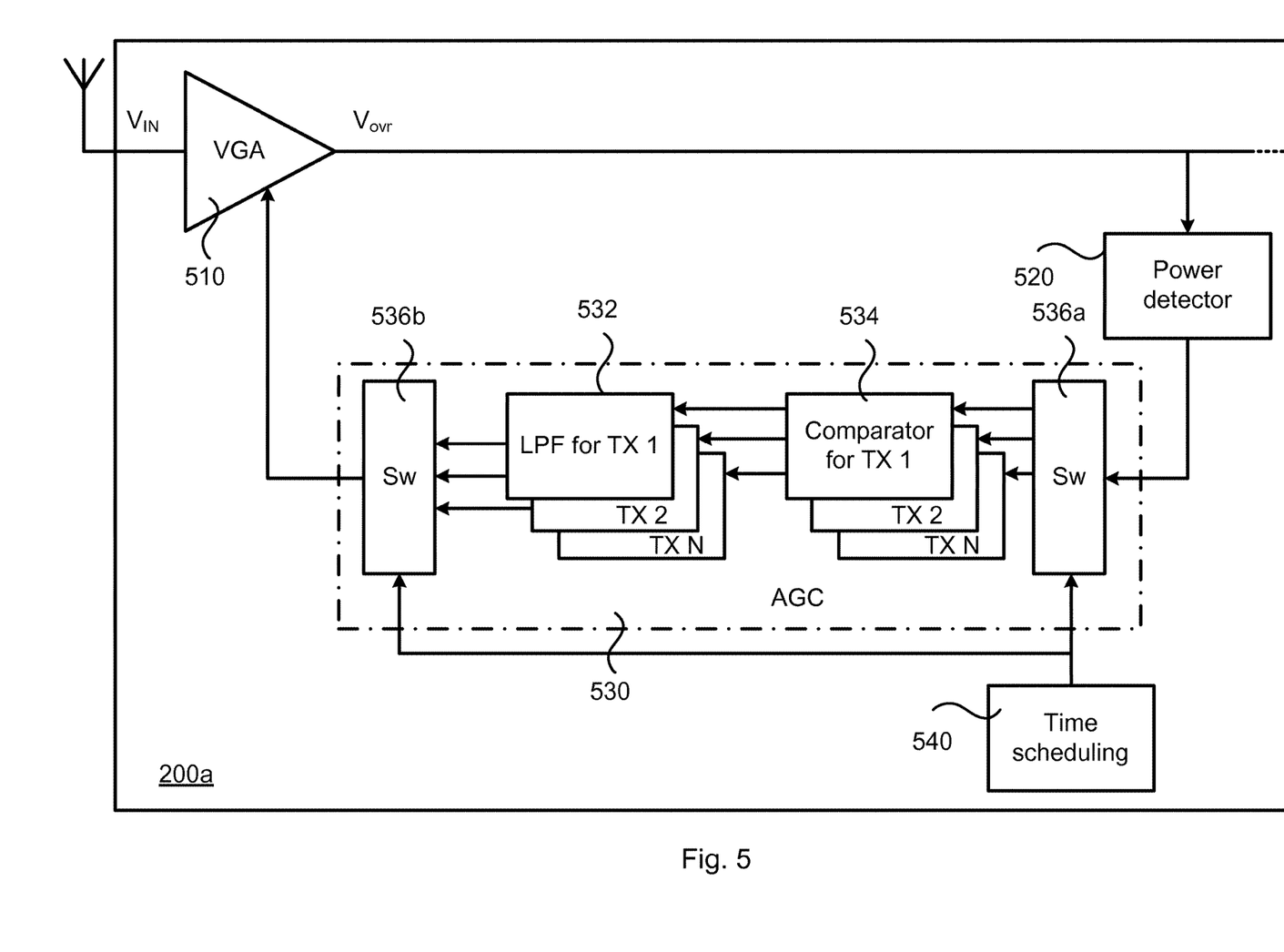
FIG. 5 is a schematic diagram showing functional modules for automatic gain control in a packet receiver according to an embodiment.

Parallel reference is here made to FIG. 5. FIG. 5 schematically illustrates application of automatic gain control in a packet receiver 200a according to embodiments. As the packet receiver 200a in FIG. 2, the packet receiver 200a of FIG. 5 comprises a VGA 510, a power detector 520, and an AGC 530. However, the packet receiver 200a in FIG. 5 differs from the packet receiver 200a of FIG. 2 in the way the AGC 530 is configured.

Specifically, the automatic gain control involves applying (step S106b) an LPF 532 to the sequence of automatic gain controlled samples. The LPF 532 is selected from a bank of LIPFs 532. Which LPF 532 to apply depends on, according to the time based scheduling, from which packet transmitter 200b, 200c, . . . , 200N the packet 300 is received Embodiments relating to further details of automatic gain control in a wireless communication network 100 for power grid control as performed by the packet receiver 200a will now be disclosed.

In some aspects the time based scheduling is based on strict timing synchronization (e.g. time-division multiple access (TDMA)) and is maintained by a central entity (e.g. a network coordinator in the wireless communication network 100) and distributed among all the nodes 200a-200N. In this way, each node 200a-200N knows exactly when it will receive a packet and from which packet transmitter. In FIG. 5 this is illustrated by information from a timing scheduling module 540 being input to the AGC 530.

In some aspects, and as in the illustrative example of FIG. 5, variable gain amplitude control is applied by a VGA 510. Particularly, according to an embodiment the packet receiver 200a is configured to perform (optional) step S104:

S104: The packet receiver 200a applies variable gain amplitude control to the sequence of samples, resulting in a sequence of variable gain amplitude controlled samples. The automatic gain control is then applied to the sequence of variable gain amplitude controlled samples.

In some aspects there is one single output value produced by the AGC 530 per received packet 300. Thus, according to an embodiment, applying the automatic gain control (as in step S106) produces one automatic gain control value for the packet 300.

In some aspects the automatic gain control value is fed to the VGA 510. Particularly, according to an embodiment the packet receiver 200a is configured to perform (optional) step S108:

S108: The packet receiver 200a feeds the automatic gain control value as a control signal. The control signal is to be used during the variable gain amplitude control when applied to a next packet 300 from the same packet transmitter 200b, 200c, . . . , 200N.

The automatic gain control value could be fed either as feed-back input (as in the illustrative example of FIG. 5) or as feed-forward input.

Advantageously, the accuracy of the automatic gain control increases with the 25 number of previously determined automatic gain control values for the same packet receiver 200b, 200c, . . . , 200N, Therefore, the use of the LPF 532 ensures that the automatic gain control value converges to its optimum value. This will be further disclosed below with reference to FIG. 6. The state of the LPF 532 might therefore not be reset after reception of each packet 300. In this respect, the state of the filter is defined by the K latest-most automatic gain control values for the same packet transmitter 200b, 200c, . . . , 200N. Particularly, according to an embodiment the automatic gain control value depends, via the LPF 532, on a previous automatic gain control value for the 5 same packet transmitter 200b, 200c, , 200N. The knowledge of the time scheduling will allow the packet receiver 200a to select the appropriate LPF 532 in the of LPFs 532 to update with the just determined automatic gain control value.

In general terms, if the packet transmitter 200b, 200c, . . . , 200N and/or packet receiver 200a move, the signal strength associated with the received packet might change, thus changing the variable gain amplification and thus the automatic gain control. In some aspects the LPF 532 is therefore reset upon detection of relative movement between the packet transmitter 200b, 200c, . . . , 200N and the packet receiver 200a. Hence, according to an embodiment the packet receiver 200b is configured to perform (optional) step S110:

S110: The packet receiver 200a receives an indication of relative movement between the packet receiver 200a and the packet transmitter 200b, 200c, . . . , 200N.

There could be different ways for the packet receiver 200a to receive the indication of relative movement. In some aspects the indication is received from protocol layers higher than the PHY layer. For example, the indication might be provided as localization information on the application layer.

The packet receiver 200a is then configured to, in and in response thereto (i.e., in response to having received the indication in step S112) perform step S114:

S114: The packet receiver 200a resets the LPF 532 to a default state, wherein in the default state the automatic gain control value does not depend on any previous automatic gain control value.

As noted above, the state of the filter is defined by the K latest-most automatic gain control values for the same packet transmitter 200b, 200c, . . . , 200N. Resetting the filter might thus comprise setting all the K latest-most automatic gain control values as used in the filter to default values.

In some aspects, and as in the illustrative example of FIG. 5, the AGC 530 comprises at least one comparator 534. Particularly, according to an embodiment the packet receiver 200a is configured to perform (optional) step S106a:

S106a: The packet receiver 200a applies applying a comparator 534 to the sequence of variable gain amplitude controlled samples before applying the LPF.

In some aspects the comparator 534 is configured to compare $V_{OUT}$ to target gain value $V_N$. Particularly, according to an embodiment, applying the comparator 534 (as in step S106a) involves comparing the sequence of variable gain amplitude controlled samples to a target gain value. In some aspects the comparator 534 is configured to determine a difference, d, where $d=V_N-V_{OUT}$. The LPF 532 is then applied to the difference, d, resulting from the comparing.

There could be different types of configurations for the comparator 534. Different embodiments relating thereto will now be disclosed.

In some aspects the AGC 530 comprises one single comparator 534. Particularly, according to an embodiment one common comparator 534 is applied irrespectively of from which packet transmitter 200b, 200c, . . . , 200N the packet 300 is received. This yields a simple implementation (both in terms of storage and use) of the comparator 534.

In some aspects the AGC 530 comprises a bank of comparators 534. Particularly, according to an embodiment the comparator 534 is selected from a bank of comparators 534. This enables the comparators 534 in the bank of comparators 534 to be tailored for different purposes and hence enables a flexible use of different comparators 534 as needed.

There could be different kinds of banks of comparators 534.

In some aspects there is as many comparators 534 as there are potential packet transmitters 200b, 200c, . . . , 200N. Particularly, according to an embodiment, which comparator 534 to apply depends on, according to the time based scheduling, from which packet transmitter 200b, 200c, . . . , 200N the packet 300 is received.

In some aspects there is as many comparators 534 as there are types of potential packet transmitters 200b, 200c, . . . , 200N. Particularly, according to an embodiment, which comparator 534 to apply depends on from which type of packet transmitter 200b, 200c, . . . , 200N the packet 300 is received. That is, there could be one comparator selected if the packet transmitter is a gateway, another comparator selected if the packet transmitter is a circuit breaker, yet another comparator selected if the packet transmitter is a circuit protector, etc.

There could be different ways to implement the selection of which LPF 532 (and which comparator 534) to use in the AGC 530. As disclosed above, information from a timing scheduling module 540 is input to the AGC 530. This input can be used to control switches 536a, 536b placed at the input to, and output from, the AGC 530. Thus, according to the illustrative example of FIG. 5 one switch 536a is placed upstream the bank of comparators 534 and the other switch is placed downstream the bank of LPFs 532. The switches 536a, 536b thus define one example of how enable the appropriate comparator-filter chain to be selected. As is understood, if there is only one single comparator 534, the first switch 536a is placed between the single comparator 534 and the bank of LPFs 532. The switches 536a, 536b can be implemented through analog or digital components, depending on the required performance and complexity.

Figure 6:
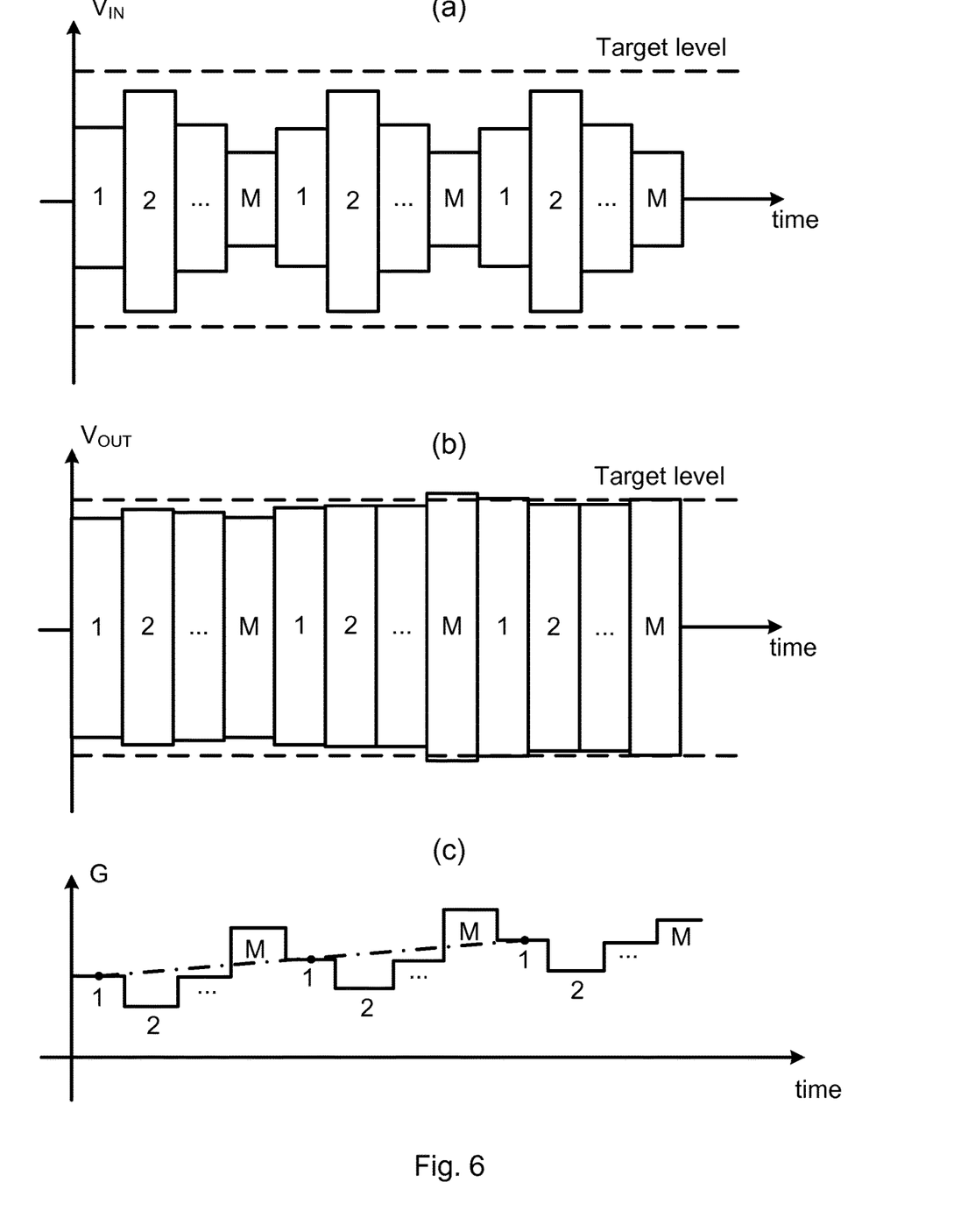
FIG. 6 schematically illustrates input amplitudes, output amplitudes, and gain values, according to an embodiment.

An example of the signal amplitudes before and after AGC for a TDMA schedule with M=N−1 packet transmitters is schematically illustrated in FIG. 6, together with the applied gain values (G). FIG. 6 at (a), (b), and (c) schematically illustrates $V_{IN}$, $V_{OUT}$, and G as a function of time, where one packet at a time is received in turn from M packet transmitters according to the time based scheduling. The values of $V_{IN}$, $V_{OUT}$ are compared to the target gain value.

As can be seen in FIG. 6, the gain values applied in consecutive packets as received from different transmitters, change significantly, requiring a fast switching process for the AGC. However, in terms of gain values applied to consecutive packets received from a specific packet transmitter the gain values are quite similar, progressively converging to the optimal value according to the LPF behavior (as given by the dash-dotted line in FIG. 6(c)).

Figure 7:
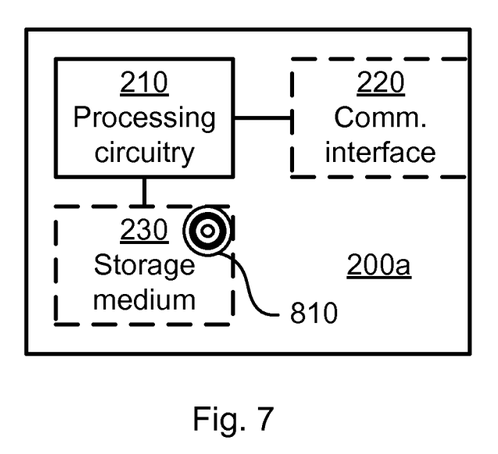
FIG. 7 is a schematic diagram showing functional units of a packet receiver according to an embodiment.

FIG. 7 schematically illustrates, in terms of a number of functional units, the components of a packet receiver 200a according to an embodiment. Processing circuitry 210 is provided using any combination of one or more of a suitable central processing unit (CPU), multiprocessor, microcontroller, digital signal processor (DSP), etc., capable of executing software instructions stored in a computer program product 810 (as in FIG. 8), e.g. in the form of a storage medium 230. The processing circuitry 210 may further be provided as at least one application specific integrated circuit (ASIC), or field programmable gate array (FPGA).

Particularly, the processing circuitry 210 is configured to cause the packet receiver 200a to perform a set of operations, or steps, S102-S104e, as disclosed above. For example, the storage medium 230 may store the set of operations, and the processing circuitry 210 may be configured to retrieve the set of operations from the storage medium 230 to cause the packet receiver 200a to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The packet receiver 200a may further comprise a communications interface 220 at least configured for communications with at least one packet transmitter 200a-200N. As such the communications interface 220 may comprise one or more transmitters and receivers, comprising analogue and digital components. The processing circuitry 210 controls the general operation of the packet receiver 200a e.g. by sending data and control signals to the communications interface 220 and the storage medium 230, by receiving data and reports from the communications interface 220, and by retrieving data and instructions from the storage medium 230. Other components, as well as the related functionality, of the packet receiver 200a are omitted in order not to obscure the concepts presented herein.

Figure 8:
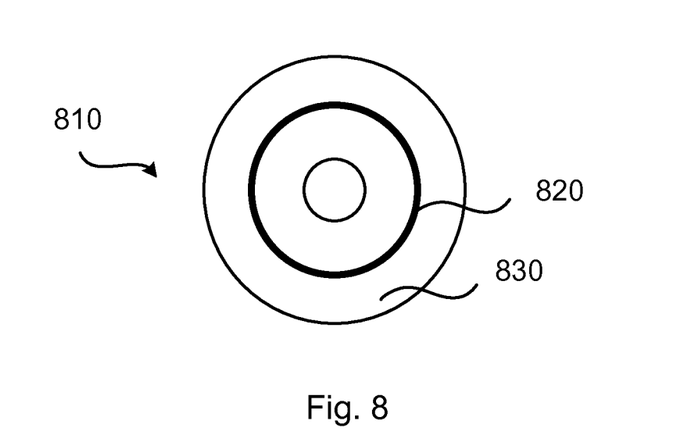
FIG. 8 shows one example of a computer program product comprising computer readable storage medium according to an embodiment.

FIG. 8 shows one example of a computer program product 810 comprising computer readable storage medium 830. On this computer readable storage medium 830, a computer program 820 can be stored, which computer program 820 can cause the processing circuitry 210 and thereto operatively coupled entities and devices, such as the communications interface 220 and the storage medium 230, to execute methods according to embodiments described herein. The computer program 820 and/or computer program product 810 may thus provide means for performing any steps as herein disclosed.

In the example of FIG. 8, the computer program product 810 is illustrated as an optical disc, such as a CD (compact disc) or a DVD (digital versatile disc) or a Blu-Ray disc. The computer program product 810 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 820 is here schematically shown as a track on the depicted optical disk, the computer program 820 can be stored in any way which is suitable for the computer program product 810.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for automatic gain control in a wireless communication network employing time based scheduling of packets, the method being performed by a packet receiver in the wireless communication network, the method comprising:
receiving a packet from a packet transmitter, the packet comprising a preamble, and the preamble being composed of a single orthogonal frequency-division multiplexing (ODFM) symbol and represented by a sequence of samples;
applying automatic gain control to the sequence of samples after variable gain amplitude control has been applied to the sequence of samples, the automatic gain control involving applying a low-pass filter (LPF) to the sequence of automatic gain controlled samples, the LPF being selected from a bank of LPFs which LPF to apply depends on, according to the time based scheduling, from which packet transmitter the packet is received, and applying the automatic gain control producing an automatic gain control value, the automatic gain control value depending, via the LPF when not in a default state, on a previous automatic gain control value for the same packet transmitter; and
feeding the automatic gain control value as a control signal to be used during the variable gain amplitude control as applied to a next packet from the same packet transmitter.

2. The method according to claim 1, further comprising:
applying the variable gain amplitude control to the sequence of samples, resulting in a sequence of variable gain amplitude controlled samples, and
the automatic gain control being applied to the sequence of variable gain amplitude controlled samples.

3. The method according to claim 1, further comprising:
receiving an indication of relative movement between the packet receiver and the packet transmitter; and
in response to receiving the indication, resetting the LPF to the default state, wherein in the default state the automatic gain control value does not depend on any previous automatic gain control value.

4. The method according to claim 2, further comprising applying a comparator to the sequence of variable gain amplitude controlled samples before applying the LPF.

5. The method according to claim 4, wherein applying the comparator comprises comparing the sequence of variable gain amplitude controlled samples to a target gain value, and wherein the LPF is applied to a difference resulting from the comparing.

6. The method according to claim 4, wherein one common comparator is applied irrespectively of from which packet transmitter the packet is received.

7. The method according to claim 4, wherein the comparator is selected from a bank of comparators.

8. The method according to claim 7, wherein which comparator to apply depends on, according to the time based scheduling, from which packet transmitter the packet is received.

9. The method according to claim 7, wherein which comparators to apply depends on from which type of packet transmitter the packet is received.

10. The method according to claim 1, wherein the packet receiver is part of a gateway, circuit breaker, circuit protector, transformer, or switchgear.

11. The method according to claim 1, wherein the packet transmitter is part of a gateway, circuit breaker, circuit protector, transformer, or switchgear.

12. A packet receiver for automatic gain control in a wireless communication network for power grid control, the wireless communication network employing time based scheduling of packets, the packet receiver comprising processing circuitry configured to cause the packet receiver to:
receive a packet from a packet transmitter, wherein the packet comprises a preamble, wherein the preamble is composed of a single orthogonal frequency-division multiplexing (OFDM) symbol and represented by a sequence of samples;
apply automatic gain control to the sequence of samples after variable gain amplitude control has been applied to the sequence of samples, wherein the automatic gain control involves applying a low-pass filter (LPF) to the sequence of automatic gain controlled samples, wherein the LPF is selected from a bank of LPFs, wherein which LPF to apply depends on, according to the time based scheduling, from which packet transmitter the packet is received, and wherein applying the automatic gain control produces an automatic gain control value, the automatic gain control value depending, via the LPF when not in a default state, on a previous automatic gain control value for the same packet transmitter; and
feed the automatic gain control value as a control signal to be used during the variable gain amplitude control when applied to a next packet from the same packet transmitter.

13. The packet receiver according to claim 12, wherein the processing circuitry is configured to cause the packet receiver to:
receive an indication of relative movement between the packet receiver and the packet transmitter; and
in response to receiving the indication, reset the LPF to the default state, wherein in the default state the automatic gain control value does not depend on any previous automatic gain control value.

14. The packet receiver according to claim 12, wherein the processing circuitry is configured to cause the packet receiver to:
apply the variable gain amplitude control to the sequence of samples, resulting in a sequence of variable gain amplitude controlled samples, and
wherein the automatic gain control is applied to the sequence of variable gain amplitude controlled samples.

15. The packet receiver according to claim 14, wherein the processing circuitry is configured to cause the packet receiver to apply a comparator to the sequence of variable gain amplitude controlled samples before applying the LPF.

16. The packet receiver according to claim 15, wherein the processing circuitry configured to cause the packet receiver to apply the comparator comprises:
   the processing circuitry configured to cause the packet receiver to compare the sequence of variable gain amplitude controlled samples to a target gain value; and
   wherein the LPF is applied to a difference resulting from the comparison.

17. The packet receiver according to claim 15, wherein the processing circuitry is configured to cause the packet receiver to apply one common comparator irrespectively of from which packet transmitter the packet is received.

18. The packet receiver according to claim 15, wherein the processing circuitry is configured to cause the packet receiver to select the comparator from a bank of comparators.

19. The packet receiver according to claim 12, wherein the packet receiver is part of a gateway, circuit breaker, circuit protector, transformer, or switchgear.

20. A non-transitory computer readable medium storing a computer program for automatic gain control in a wireless communication network for power grid control, the wireless communication network employing time based scheduling of packets, the computer program comprising computer code which, when run on processing circuitry of a packet receiver, causes the packet receiver to:

receive a packet from a packet transmitter, wherein the packet comprises a preamble, wherein the preamble is composed of a single orthogonal frequency-division multiplexing (OFDM) symbol and represented by a sequence of samples;

apply automatic gain control to the sequence of samples after variable gain amplitude control has been applied to the sequence of samples, wherein the automatic gain control comprises applying a low-pass filter (LPF) to the sequence of automatic gain controlled samples, wherein the LPF is selected from a bank of LPFs, wherein which LPF to apply depends on, according to the time based scheduling, from which packet transmitter the packet is received, and wherein applying the automatic gain control produces an automatic gain control value, the automatic gain control value depending, via the LPF when not in a default state, on a previous automatic gain control value for the same packet transmitter; and feed the automatic gain control value as a control signal to be used during the variable gain amplitude control when applied to a next packet from the same packet transmitter.

* * * * *

UNITED STATES PATENT AND TRADEMARK OFFICE
CERTIFICATE OF CORRECTION

PATENT NO. : 11,025,217 B2  
APPLICATION NO. : 16/969602  
DATED : June 1, 2021  
INVENTOR(S) : Pang et al.

Page 1 of 1

It is certified that error appears in the above-identified patent and that said Letters Patent is hereby corrected as shown below:

In the Claims

Claim 5, Column 9; Line 63 delete "wherein"

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*